United States Patent
Briere

(10) Patent No.: US 8,866,190 B2
(45) Date of Patent: Oct. 21, 2014

(54) METHODS OF COMBINING SILICON AND III-NITRIDE MATERIAL ON A SINGLE WAFER

(75) Inventor: Mike Briere, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/452,549

(22) Filed: Jun. 14, 2006

(65) Prior Publication Data

US 2006/0289876 A1 Dec. 28, 2006

Related U.S. Application Data

(60) Provisional application No. 60/690,389, filed on Jun. 14, 2005.

(51) Int. Cl.
| | |
|---|---|
| H01L 29/78 | (2006.01) |
| H01L 21/02 | (2006.01) |
| H01L 29/04 | (2006.01) |
| H01L 29/267 | (2006.01) |
| H01L 29/20 | (2006.01) |
| H01L 29/16 | (2006.01) |

(52) U.S. Cl.
CPC ...... *H01L 29/2003* (2013.01); *H01L 21/02587* (2013.01); *H01L 29/045* (2013.01); *H01L 21/0237* (2013.01); *H01L 29/267* (2013.01); *H01L 21/02494* (2013.01); *H01L 21/0254* (2013.01); *H01L 29/16* (2013.01); *H01L 21/02502* (2013.01); *H01L 21/02532* (2013.01); *H01L 21/02381* (2013.01); *H01L 21/02488* (2013.01); *H01L 21/0245* (2013.01)
USPC ..... 257/192; 257/368; 257/E27.06; 257/E29.255; 257/E29.248

(58) Field of Classification Search
CPC ............ H01L 29/2003; H01L 29/7787; H01L 29/778
USPC ..................... 257/20, 195, 368, 192, E29.255, 257/E29.248, E27.06
See application file for complete search history.

(56) References Cited

U.S. PATENT DOCUMENTS

| | | | | |
|---|---|---|---|---|
| 6,649,287 | B2 * | 11/2003 | Weeks et al. ............... | 428/698 |
| 2002/0074552 | A1 * | 6/2002 | Weeks et al. ................ | 257/76 |
| 2005/0184343 | A1 * | 8/2005 | Thornton et al. ........... | 257/351 |
| 2006/0284247 | A1 * | 12/2006 | Augustine et al. .......... | 257/338 |

\* cited by examiner

*Primary Examiner* — Minchul Yang
(74) *Attorney, Agent, or Firm* — Farjami & Farjami LLP

(57) ABSTRACT

A semiconductor device that includes one semiconductor device formed in one semiconductor material and a second semiconductor device formed in another semiconductor material on a common substrate, and a method of fabricating the semiconductor device.

20 Claims, 6 Drawing Sheets

METHODS OF COMBINING SILICON AND III-NITRIDE MATERIAL ON A SINGLE WAFER

RELATED APPLICATION

This application is based on and claims benefit of U.S. Provisional Application No. 60/690,389, filed on Jun. 14, 2005, entitled METHODS OF COMBINING SILICON AND III-NITRIDE MATERIAL ON A SINGLE WAFER, to which a claim of priority is hereby made and the disclosure of which is incorporated herein by reference.

BACKGROUND OF THE INVENTION

The present invention relates to semiconductor devices and methods for fabricating semiconductor devices.

Some semiconductor materials such as silicon are desirable as base material for forming IC devices for, for example, driving other devices such as power MOSFETs.

Other materials are desirable for forming switching devices. For example, III-N semiconductor materials may are desirable for serving as a base material for power switching devices. One example of such a material is GaN.

It is desirable to have a single die which includes one semiconductor body with optimum use for an IC application and another for power switching application so that the driver IC and the power switch may be formed in a common die.

SUMMARY OF THE INVENTION

A semiconductor device according to the present invention includes:
a common substrate;
a first semiconductor device formed over a first surface of the substrate; and
a second semiconductor device formed over the first surface and disposed lateral to the first semiconductor device;
wherein the first semiconductor device is comprised of a first semiconductor material, and the second semiconductor device is comprised of a second semiconductor material that is different from the first semiconductor material.

According to one aspect of the present invention the second material may have a higher band gap than the first material. Thus, for example, the first material may be silicon and the second material may be a III-N semiconductor material. An example of a III-nitride material is GaN. While Si, SiC, sapphire, or even GaN can be used as a substrate, silicon is most preferred for economic reasons.

According to another aspect of the present invention the first semiconductor device may include a control IC and the second semiconductor device may be a power switching device that is controlled by the control IC.

A device according to the present invention may further include an insulation wall disposed between the first semiconductor device and the second semiconductor device. In addition, the device may further include an interlayer disposed between the second semiconductor device and the common substrate.

In one preferred embodiment, the common substrate may be comprised of silicon, the first material may be comprised of silicon, the second material may be comprised of a III-N semiconductor, the interlayer may be comprised of a compositionally graded III-N material (e.g. AlN), and the insulation wall may be comprised of silicon dioxide. Preferably, the first semiconductor device may be formed in <100> silicon that is epitaxially formed over a <100> silicon wafer. Moreover, preferably, the second semiconductor device is comprised of a III-N semiconductor material that is formed on a <111> silicon body residing on a silicon dioxide body lying on the substrate.

A method according to the present invention may include:
providing a semiconductor body of one semiconductor material;
removing a portion of the semiconductor body to create a receiving region; and
forming another semiconductor body of another semiconductor material in the receiving region.

According to one aspect of the present invention the one semiconductor material may be comprised of silicon and the another semiconductor material may be comprised of a semiconductor material of a higher band gap than that of silicon. For example, the one semiconductor material may be comprised of silicon and the another semiconductor material may be comprised of a III-N semiconductor material, such as a semiconductor alloy from the InAlGaN system (e.g. GaN).

Other features and advantages of the present invention will become apparent from the following description of the invention which refers to the accompanying drawings.

DETAILED DESCRIPTION OF THE FIGURES

Figure 1:
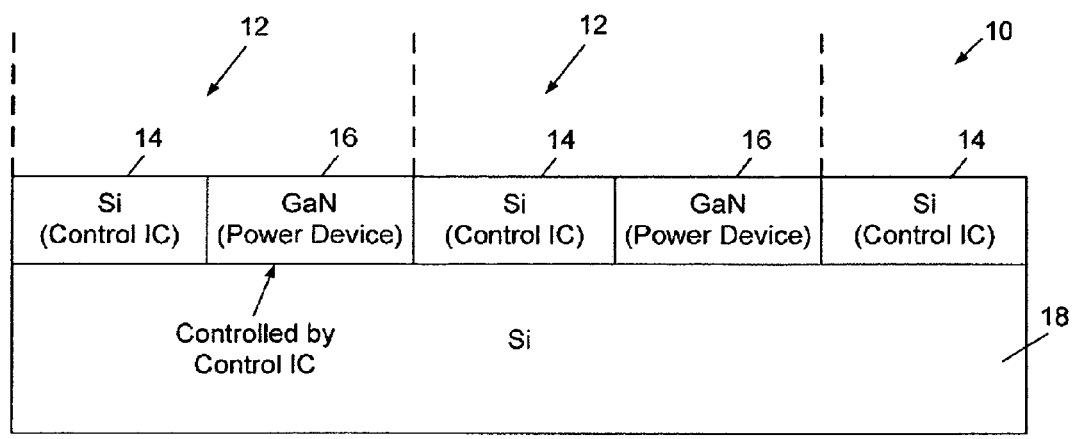
FIGS. 1-5 each shows a cross-sectional view of a portion of a wafer containing a die according to the first, second, third, fourth, and fifth embodiment of the present invention respectively.

Referring to FIG. 1, there is shown a portion of a wafer 10 containing a plurality of semiconductor die 12 according to the present invention. A semiconductor device according to the present invention would include at least first semiconductor body 14, and at least second semiconductor body 16 disposed lateral to first semiconductor body 14. Preferably, first semiconductor body 14 and second semiconductor body 16 are formed over common substrate 18. According to the present invention first semiconductor body 14 is comprised of a first semiconductor material such as silicon, and second semiconductor body 16 is comprised of a second semiconductor material that is different from the first semiconductor material. For example, second semiconductor material has a higher band gap than that of silicon, such a III-N semiconductor material. A preferred material for forming second semiconductor body 16 is GaN.

GaN is preferred in that it can be used to form a power device such as a high electron mobility transistor (HEMT). Thus, a die according to the present invention can be used as a basic platform for forming a semiconductor device having a control IC formed in first semiconductor body 14, which is made preferably from silicon, and a power device, such as a HEMT, in second semiconductor body 16.

It should be noted that in the preferred embodiment substrate 18 is formed from silicon for economic reasons. However, other substrate materials such as SiC or Sapphire may be used without deviating from the scope and spirit of the present invention.

Figure 2:
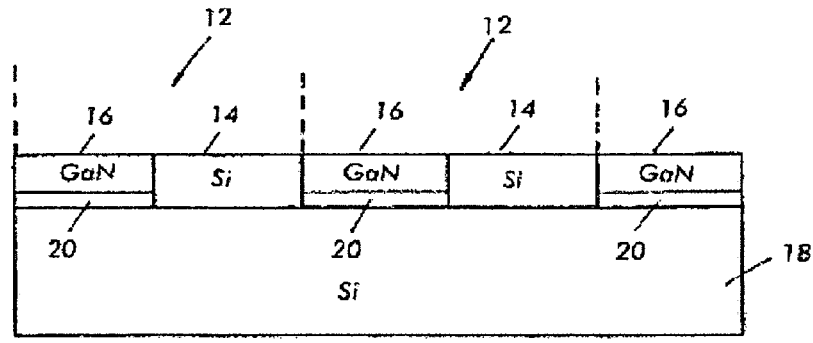

Referring to FIG. 2, according to the second embodiment of the present invention first semiconductor body 14 and substrate 18 are composed of the same material, for example, Si, while second semiconductor body 16 is comprised of another semiconductor material, for example, GaN. Thus, according to the second embodiment of the present invention interlayer 20 can be disposed between second semiconductor body 16 and substrate 20. Interlayer 20 may be required, for example, to alleviate stresses which may be caused by the dissimilarity between second semiconductor body 16 and substrate 18. Thus, in the preferred embodiment in which second semiconductor body 16 is composed of GaN and substrate 18 is composed of Si, interlayer 20 may be composed of a composition graded GaN body.

Figure 3:
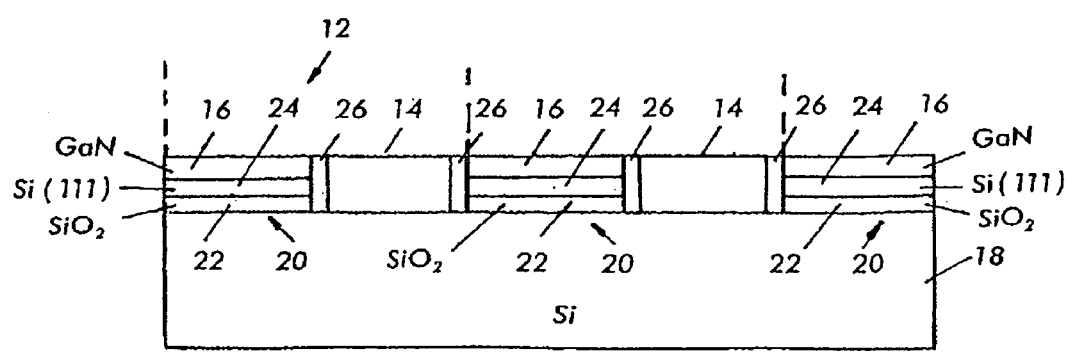

Referring next to FIG. 3, according to the third embodiment of the present invention, interlayer 20 may include more than one material body. Thus, interlayer 20 may include first interlayer 22, and second interlayer 24 stacked over first interlayer 22. Second semiconductor body 16 is disposed atop second interlayer 24, and first interlayer 22 is disposed atop substrate 18. In the preferred embodiment of the present invention, second semiconductor body 16 is composed of GaN, and substrate 18 and first semiconductor body 14 are composed of (100) silicon. The (100) silicon is particularly desired for fabricating an IC circuit. However, it is desired to have (111) as a base for GaN. Thus, in the preferred embodiment first interlayer 22 is composed of $SiO_2$, and second interlayer 24 is composed of (111). As a result, according to the preferred embodiment of the first embodiment a (100) silicon body and a GaN body can be formed on a common substrate. An interlayer 20 having more than one material body, enables the designer to optimize the crystal orientation of the materials used. Also, preferably, in the third embodiment of the present invention barrier 26 is disposed between first semiconductor body 14 and second semiconductor body 16. Barrier 26 may be composed of a dielectric material such as $SiO_2$ or SiN, and may extend to substrate 18, whereby it is lodged between first semiconductor body 14 and second semiconductor body 16.

Figure 4:
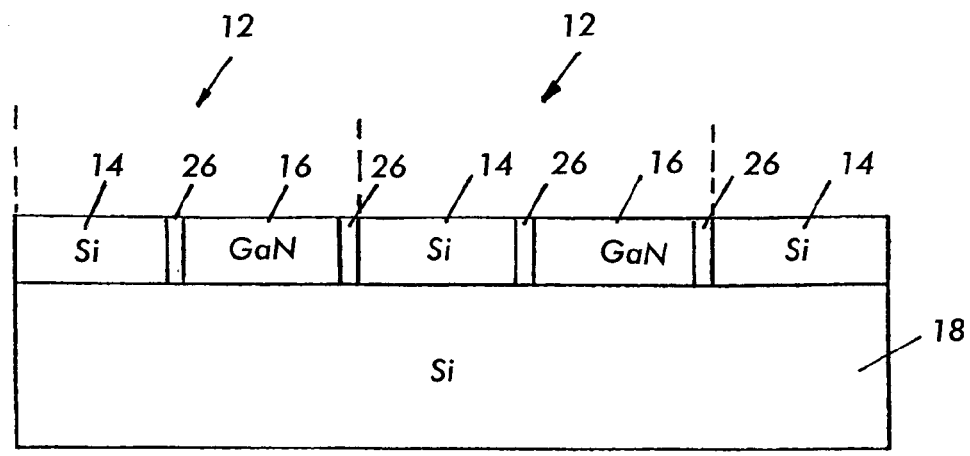

Referring next to FIG. 4, the fourth embodiment of the present invention is similar to the first embodiment except that it also includes a barrier 26 between first semiconductor body 14 and second semiconductor body 16. Barrier 26 is preferably composed of a dielectric such as $SiO_2$ or SiN and extends from the top surfaces of first semiconductor body 14 and second semiconductor body 16 to substrate 18.

Figure 5:
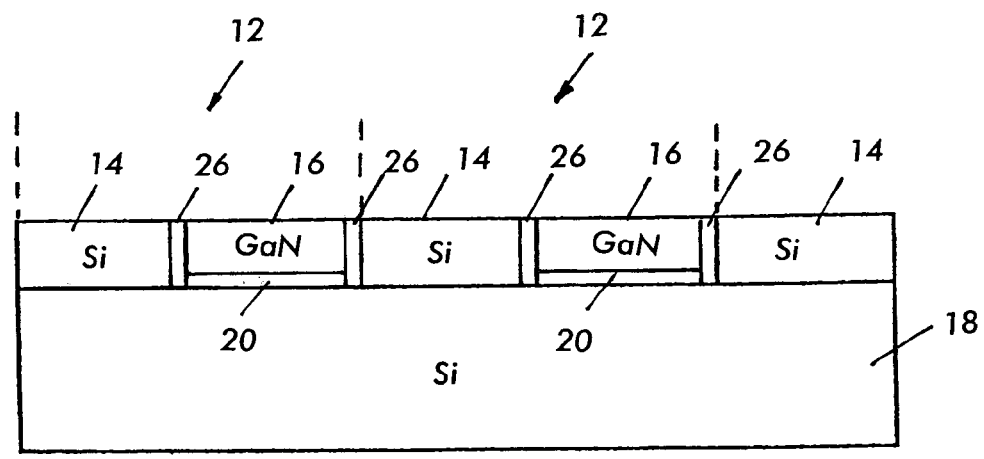

Referring next to FIG. 5, the fifth embodiment of the present invention is similar to the fourth embodiment except that it includes interlayer 20 disposed between second semiconductor body 16 and substrate 18. In the preferred embodiment of the present invention substrate 18 is preferably composed of silicon, second semiconductor body 16 is composed of GaN and interlayer 20 is composed of compositionally graded GaN.

Figure 6A:
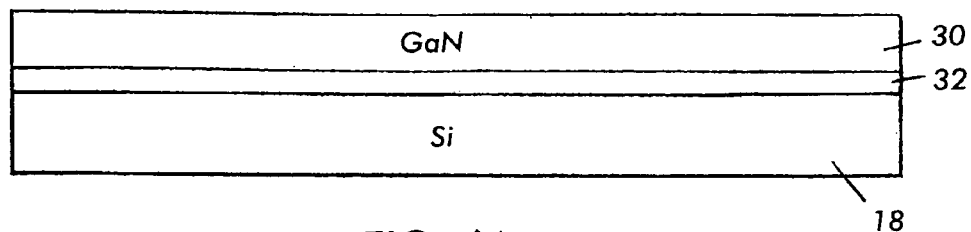
FIGS. 6A-6C illustrate a process for fabricating a device according to the present invention.
Figure 6B:
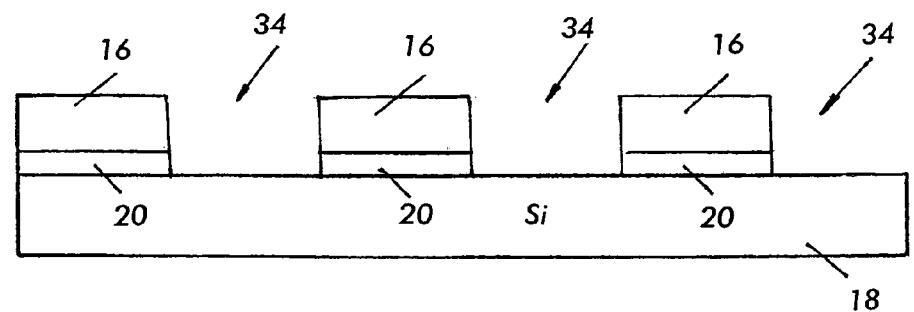
Figure 6C:
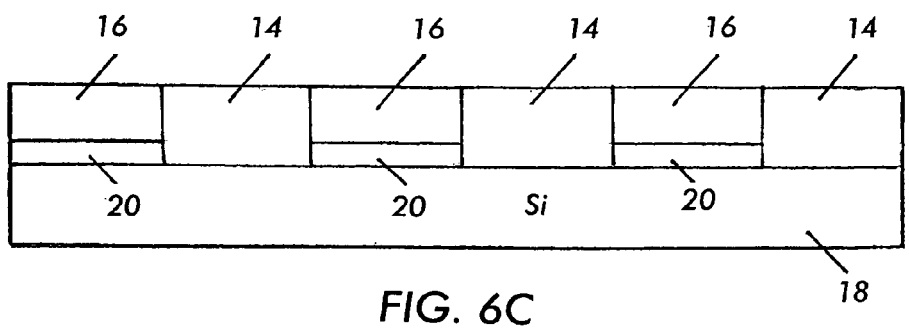

Referring now to FIGS. 6A-6C, in a process for fabricating a device according to the present invention a wafer comprising substrate 18, and a semiconductor body 30 disposed over a major surface of substrate 18 is provided. Substrate 18 may be composed of silicon and semiconductor body 30 may be composed of a material for forming second semiconductor bodies 16, such as a III-Nitride material, for example, GaN. Note that a material body 32 for forming interlayers 20 may also be included with the wafer.

Referring next to FIG. 6B, portions of the wafer shown in FIG. 6A are removed to create a plurality of cavities 34 each reaching at least substrate 18. As a result, a plurality of second semiconductor bodies 16 and interlayers 20 are also formed.

Thereafter, a first semiconductor body 14 is formed in each respective cavity 34 by, for example, epitaxial growth or the like. Thus, in the preferred embodiment silicon is epitaxially grown over the exposed surfaces at the bottom of cavities 34 by epitaxial growth to form first semiconductor bodies 14, as seen in FIG. 6C.

Referring next to FIGS. 7A-7D, an alternative process for fabricating a device according to the present invention includes providing a wafer having a substrate 18, and a semiconductor body 36 which is preferably comprised of a material for forming first semiconductor bodies 14. In the preferred embodiment, substrate 18 may be composed of silicon and semiconductor body 36 may also be composed of silicon. Alternatively, instead of semiconductor body 36 and substrate 18, a single crystal wafer of silicon may be used.

Figure 7A:
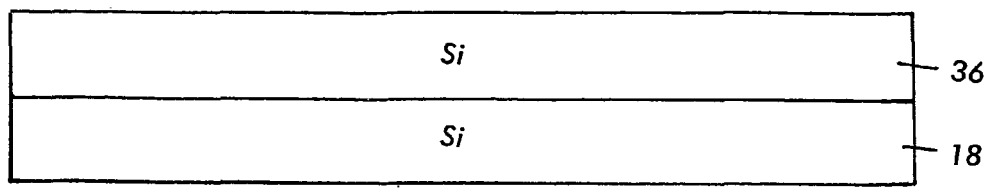
FIGS. 7A-7D illustrate an alternative process for fabricating a device according to the present invention.
Figure 7B:
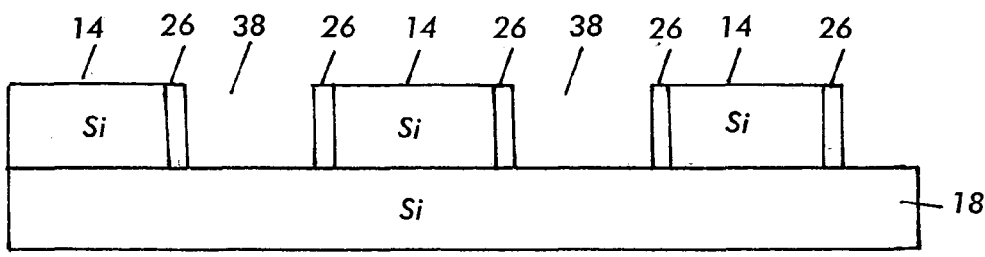

Referring next to FIG. 7B, portions of semiconductor body 36 are removed to create cavities 38 each reaching at least substrate 18, and to form first semiconductor bodies 14. Thereafter, barriers 26 are formed on the sidewalls of cavities 38. Thus, in the preferred embodiment, the silicon sidewalls of cavities 38 are oxidized to form barriers 26 composed of $SiO_2$.

Figure 7C:
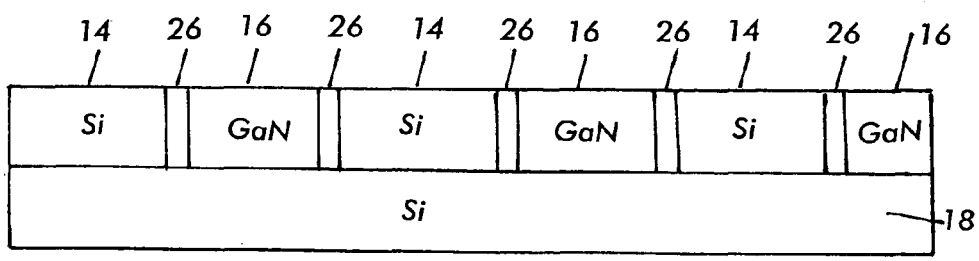

Referring next to FIG. 7C, according to one alternative process second semiconductor bodies 16 are formed in respective cavities 38 by epitaxial growth or the like over the exposed surface of substrate 18 at the bottom of each cavity 38.

Figure 7D:
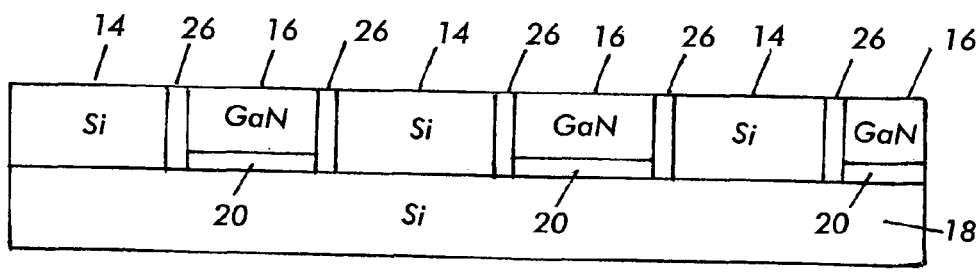

Referring next to FIG. 7D, in another alternate embodiment, prior to formation of second semiconductor bodies 16 a respective interlayer 20 is formed at the bottom of each respective cavity 38 over substrate 18. Thus, for example, when GaN or another III-Nitride material is selected for forming second semiconductor bodies 16, interlayers 20 composed of compositionally graded GaN or the like may be formed prior to forming second semiconductor bodies 16.

Referring next to FIGS. 8A-8D, in yet another alternate process for fabricating a device according to the present invention, a wafer that includes substrate 18 having a material stack atop thereof is provided. Material stack 40 includes first layer 42, second layer 44, and third layer 46. In the preferred embodiment of the present invention, substrate 18 is composed of (100) silicon, first layer 42 is composed of $SiO_2$, second layer 44 is composed of (111) silicon, and third layer 46 is composed of a material for forming second semiconductor bodies 16, such a III-Nitride material, for example, GaN.

Figure 8A:
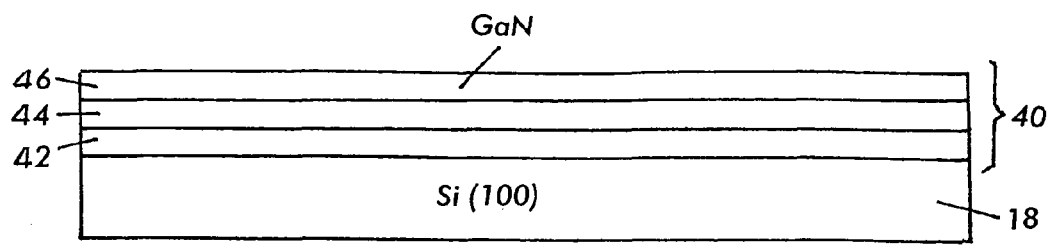
FIGS. 8A-8D illustrate another alternative process for fabricating a device according to the present invention.
Figure 8B:
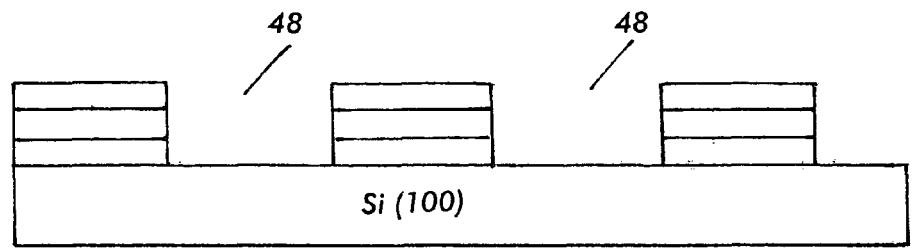
Figure 8C:
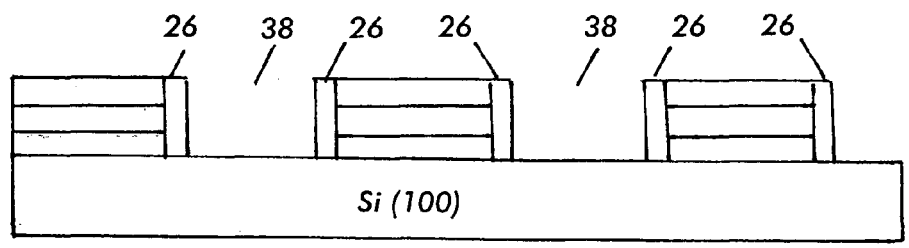
Figure 8D:
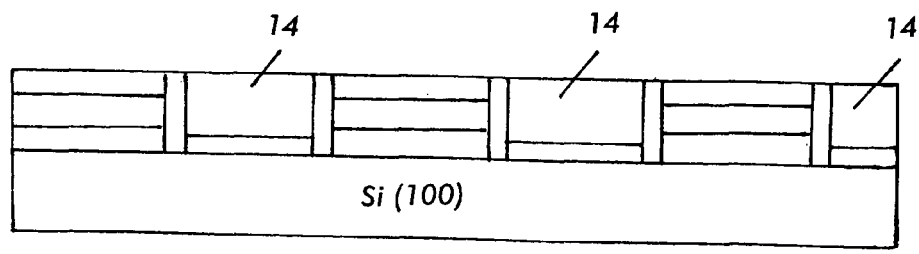

Referring next to FIG. 8B, portions of stack 40 are removed to create cavities 48 each reaching at least an exposed surface of substrate 18, and to create second semiconductor bodies 16, and first interlayer 22 and second interlayer 24 under each second semiconductor body 16. Next, barriers 26 are formed on the sidewalls of each cavity 48 as seen in FIG. 8C. Barriers 26 may be formed of a dielectric material such as $SiO_2$ or SiN or the like. Thereafter, a first semiconductor body 14 is formed in each cavity over the exposed surface of substrate 18 at the bottom thereof. In the preferred embodiment of the present invention, first semiconductor bodies 14 are formed with (100) silicon, which is a desirable material for forming IC's.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated semiconductor device, comprising:
a common semiconductor substrate;
a first semiconductor device comprising a control IC formed over a surface of the common semiconductor substrate; and
a second semiconductor device comprising a power switching device formed over the surface of the common semiconductor substrate and disposed lateral to the first semiconductor device;
wherein the first semiconductor device includes a first semiconductor body comprised of a first semiconductor body material, and the second semiconductor device includes a second semiconductor body comprised of a second semiconductor body material having a higher band gap than the first semiconductor body material, and wherein the control IC is in the first semiconductor body and said power switching device is controlled by said control IC, said control IC being formed in only one semiconductor body.

2. The integrated semiconductor device of claim 1, wherein the first semiconductor body material is silicon and the second semiconductor body material is a III-N semiconductor.

3. The integrated semiconductor device of claim 1, further comprising an insulation wall disposed between the first semiconductor device and the second semiconductor device.

4. The integrated semiconductor device of claim 1, further comprising an interlayer disposed between the second semiconductor device and the common semiconductor substrate.

5. The integrated semiconductor device of claim 1, wherein the common semiconductor substrate is comprised of silicon, the first semiconductor body material is comprised of silicon, the second semiconductor body material is comprised of a III-N semiconductor, and further comprising an interlayer comprised of a compositionally graded III-N material disposed between the second semiconductor device and the common semiconductor substrate, and an insulation wall comprised of silicon dioxide between the first semiconductor device and the second semiconductor device.

6. The integrated semiconductor device of claim 1, wherein the first semiconductor body is comprised of <100> silicon.

7. The integrated semiconductor device of claim 1, wherein the first semiconductor body is comprised of <100> silicon and the common semiconductor substrate is comprised of <100> silicon.

8. The integrated semiconductor device of claim 1, wherein the second semiconductor body is comprised of a III-N semiconductor body material that is formed on <111> silicon.

9. The integrated semiconductor device of claim 1, wherein the second semiconductor device is comprised of a III-nitride heterojunction.

10. The integrated semiconductor device of claim 9, wherein said heterojunction includes a first III-nitride semiconductor body comprised of a first semiconductor alloy from the InAlGaN system and a second III-nitride semiconductor body comprised of a second semiconductor alloy from the InAlGaN system.

11. The integrated semiconductor device of claim 10, wherein the first semiconductor alloy is GaN, and the second semiconductor alloy is AlGaN.

12. An integrated semiconductor wafer, comprising:
a common semiconductor substrate;
a plurality of first semiconductor devices formed over a surface of said common semiconductor substrate; and
a plurality of second semiconductor devices formed over said surface of said common semiconductor substrate and each disposed lateral to at least one of said plurality of first semiconductor devices;
wherein said plurality of first semiconductor devices each include a control IC in a first semiconductor body comprised of a first semiconductor body material, and said plurality of second semiconductor devices each include a power switching device in a second semiconductor body comprised of a second semiconductor body material having a higher band gap than said first semiconductor body material, said control IC being formed in only one semiconductor body.

13. The integrated semiconductor wafer of claim 12, wherein said first semiconductor body material comprises silicon and said second semiconductor body material comprises a III-N semiconductor.

14. The integrated semiconductor wafer of claim 12, further comprising a plurality of first interlayers, each disposed between a respective second semiconductor device and said common semiconductor substrate.

15. The integrated semiconductor wafer of claim 14, further comprising a plurality of second interlayers, each disposed over a respective first interlayer.

16. The integrated semiconductor wafer of claim 12, wherein said first semiconductor body material comprises <100> silicon, said common substrate comprises <100> silicon, and said plurality of second interlayers comprise <111> silicon.

17. The integrated semiconductor wafer of claim 12, wherein said plurality of second semiconductor devices comprise High Electron Mobility Transistors.

18. An integrated semiconductor device, comprising:
a common semiconductor substrate;
a control IC formed over a surface of said common semiconductor substrate; and
a High Electron Mobility Transistor formed over said surface of said common semiconductor substrate and disposed lateral to said control IC;
wherein said control IC is in a silicon semiconductor body, and said High Electron Mobility Transistor is in of a III-N semiconductor body, and wherein said High Electron Mobility Transistor is controlled by said control IC, said control IC being formed in only one semiconductor body.

19. The integrated semiconductor device of claim 18, wherein said High Electron Mobility Transistor further comprises AlGaN disposed on said III-N semiconductor body.

20. The integrated semiconductor device of claim 18, wherein said silicon semiconductor body comprises <100> silicon, said common substrate comprises <100> silicon, and said III-N semiconductor body is formed on an interlayer comprised of <111> silicon.

* * * * *